United States Patent
Kaczman

(10) Patent No.: US 9,660,688 B2
(45) Date of Patent: *May 23, 2017

(54) APPARATUS AND METHODS FOR POWER AMPLIFIER OUTPUT MATCHING

(71) Applicant: SKYWORKS SOLUTIONS, INC., Woburn, MA (US)

(72) Inventor: Daniel Lee Kaczman, Newbury Park, CA (US)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/173,362

(22) Filed: Jun. 3, 2016

(65) Prior Publication Data

US 2016/0285499 A1    Sep. 29, 2016

Related U.S. Application Data

(63) Continuation of application No. 14/306,013, filed on Jun. 16, 2014, now Pat. No. 9,391,567.

(51) Int. Cl.

| | |
|---|---|
| *H04B 1/38* | (2015.01) |
| *H04B 1/40* | (2015.01) |
| *H03F 1/56* | (2006.01) |
| *H03F 3/19* | (2006.01) |
| *H03F 1/02* | (2006.01) |
| *H03F 3/24* | (2006.01) |
| *H03F 3/195* | (2006.01) |

(52) U.S. Cl.
CPC ............... *H04B 1/40* (2013.01); *H03F 1/025* (2013.01); *H03F 1/565* (2013.01); *H03F 3/19* (2013.01); *H03F 3/195* (2013.01); *H03F 3/245* (2013.01); *H03F 2200/102* (2013.01); *H03F 2200/321* (2013.01); *H03F 2200/387* (2013.01); *H03F 2200/391* (2013.01); *H03F 2200/411* (2013.01); *H03F 2200/451* (2013.01)

(58) Field of Classification Search
CPC ............... H03F 3/191; H03F 1/22; H03F 3/42
USPC ......................................................... 455/73
See application file for complete search history.

(56) References Cited

U.S. PATENT DOCUMENTS

| | | |
|---|---|---|
| 8,598,950 B2 | 12/2013 | Khesbak |
| 8,610,503 B2 | 12/2013 | Kaczman et al. |
| 8,717,100 B2 | 5/2014 | Reisner et al. |
| 8,797,103 B2 | 8/2014 | Kaczman et al. |
| 8,803,615 B2 | 8/2014 | Cabanillas et al. |

(Continued)

*Primary Examiner* — Eugene Yun
(74) *Attorney, Agent, or Firm* — Knobbe Martens Olson & Bear LLP

(57) ABSTRACT

Apparatus and methods for power amplifier output matching is provided. In certain configurations, an output matching circuit includes a supply voltage biasing circuit electrically connected between an input node and a power high supply voltage, a second-order harmonic series resonant circuit electrically connected between the input node and a power low supply voltage, a third-order harmonic parallel resonant circuit electrically connected between the input node and a harmonic frequency grounding node, a third-order harmonic series resonant circuit electrically connected between the harmonic frequency grounding node and the power low supply voltage, and a DC blocking capacitor electrically connected between the harmonic frequency grounding node and an output node.

20 Claims, 12 Drawing Sheets

(56) References Cited

U.S. PATENT DOCUMENTS 8,970,299 B2    3/2015   Hase
9,391,567 B2    7/2016   Kaczman

APPARATUS AND METHODS FOR POWER AMPLIFIER OUTPUT MATCHING

CROSS-REFERENCE TO RELATED APPLICATIONS

This application is a continuation of U.S. patent application Ser. No. 14/306,013, filed Jun. 16, 2014, entitled "APPARATUS AND METHODS FOR POWER AMPLIFIER OUTPUT MATCHING," which is herein incorporated by reference in its entirety.

BACKGROUND

Field

Embodiments of the invention relate to electronic systems, and in particular, to radio frequency (RF) electronics.

Description of the Related Technology

RF power amplifiers can be used to boost the power of an RF signal having a relatively low power. Thereafter, the boosted RF signal can be used for a variety of purposes, included driving an antenna of a transmitter.

Power amplifiers can be included in mobile phones to amplify an RF signal for transmission. For example, in mobile phones having a time division multiple access (TDMA) architecture, such as those found in Global System for Mobile Communications (GSM), code division multiple access (CDMA), and wideband code division multiple access (W-CDMA) systems, a power amplifier can be used to amplify an RF signal. It can be important manage the amplification of the RF signal, as a desired transmit power level can depend on how far the user is away from a base station and/or the mobile environment. Power amplifiers can also be employed to aid in regulating the power level of the RF signal over time, so as to prevent signal interference from transmission during an assigned receive time slot.

An output matching circuit can be included at the output of a power amplifier. The output matching circuit can be used to increase power transfer and/or reduce reflections of the amplified RF signal generated by the power amplifier.

SUMMARY

In certain embodiments, the present disclosure relates to a power amplifier system including a power amplifier and an output matching circuit. The power amplifier is configured to amplify a radio frequency input signal having a fundamental frequency, and the power amplifier includes an input configured to receive the radio frequency input signal and an output configured to generate an amplified radio frequency signal. The output matching circuit includes a second-order harmonic series resonant circuit electrically connected between the output of the power amplifier and a power low supply voltage, a third-order harmonic parallel resonant circuit electrically connected between the output of the power amplifier and a harmonic frequency grounding node, and a third-order harmonic series resonant circuit electrically connected between the harmonic frequency grounding node and the power low supply voltage. The third-order harmonic series resonant circuit is configured to resonate at about three times the fundamental frequency so as to provide a low impedance path between the harmonic frequency grounding node and the power low supply voltage at about three times the fundamental frequency.

In various embodiments, the second-order harmonic series resonant circuit is configured to resonate at about two times the fundamental frequency, and the third-order harmonic parallel resonant circuit configured to resonate at about three times the fundamental frequency.

In a number of embodiments, the output matching circuit further includes a supply voltage biasing circuit electrically connected between the output of the power amplifier and a power high supply voltage. In some embodiments, the power amplifier system further includes an envelope tracker configured to generate the power high supply voltage.

In certain embodiments, the output matching circuit further includes a DC blocking capacitor electrically connected between the harmonic frequency grounding node and an output node. According to some embodiments, the power amplifier system further comprising a radio frequency front end including an input electrically connected to the output node of the output matching circuit.

In some embodiments, the second-order harmonic series resonant circuit includes an inductor and a capacitor electrically connected in series between the output of the power amplifier and the power low supply voltage, and the inductor and the capacitor are configured to resonate at about two times the fundamental frequency.

In a number of embodiments, the third-order harmonic series resonant circuit includes an inductor and a capacitor electrically connected in series between the harmonic frequency grounding node and the power low supply voltage, the inductor and the capacitor configured to resonate at about three times the fundamental frequency.

According to various embodiments, the third-order harmonic parallel resonant circuit includes a capacitor and an inductor configured to resonate at about three times the fundamental frequency, the inductor electrically connected between the output of the power amplifier and the harmonic frequency grounding node and the capacitor electrically connected between the output of the power amplifier and the power low supply voltage.

In certain embodiments, the present disclosure relates to an output matching circuit for a power amplifier that amplifies a radio frequency signal having a fundamental frequency. The output matching circuit includes a second-order harmonic series resonant circuit, a third-order harmonic parallel resonant circuit, and a third-order harmonic series resonant circuit. The second-order harmonic series resonant circuit is electrically connected between an input node and a power low supply voltage, and the second-order harmonic series resonant circuit is configured to resonate at about two times the fundamental frequency. The third-order harmonic parallel resonant circuit is electrically connected between the input node and a harmonic frequency grounding node, and the third-order harmonic parallel resonant circuit is configured to resonate at about three times the fundamental frequency. The third-order harmonic series resonant circuit is electrically connected between the harmonic frequency grounding node and the power low supply voltage, and the third-order harmonic series resonant circuit is configured to resonate at about three times the fundamental frequency so as to provide a low impedance path between the harmonic frequency grounding node and the power low supply voltage at about three times the fundamental frequency.

In various embodiments, the second-order harmonic series resonant circuit includes an inductor and a capacitor electrically connected in series between the input node and the power low supply voltage, and the inductor and the capacitor are configured to resonate at about two times the fundamental frequency.

In certain embodiments, the third-order harmonic series resonant circuit includes an inductor and a capacitor electrically connected in series between the harmonic frequency grounding node and the power low supply voltage, and the inductor and the capacitor configured to resonate at about three times the fundamental frequency.

In various embodiments, the third-order harmonic parallel resonant circuit includes a capacitor and an inductor configured to resonate at about three times the fundamental frequency, and the inductor is electrically connected between the input node and the harmonic frequency grounding node and the capacitor is electrically connected between the input node and the power low supply voltage.

In certain embodiments, the present disclosure relates to a power amplifier module. The power amplifier module includes an input pin configured to receive a radio frequency input signal having a fundamental frequency, an output pin configured to output an amplified radio frequency signal, a power low pin configured to receive a power low supply voltage, a power amplifier die, and an output matching circuit. The power amplifier die includes an input pad electrically connected to the input pin and an output pad. The output matching circuit includes a second-order harmonic series resonant circuit electrically connected between the output pad and the power low pin, a third-order harmonic parallel resonant circuit electrically connected between the output pad and a harmonic frequency grounding node, and a third-order harmonic series resonant circuit electrically connected between the harmonic frequency grounding node and the power low pin. The third-order harmonic series resonant circuit is configured to resonate at about three times the fundamental frequency so as to provide a low impedance path between the harmonic frequency grounding node and the power low pin at about three times the fundamental frequency.

In various embodiments, the power amplifier module further includes a surface mount capacitor electrically connected between the harmonic frequency grounding node and the output pin.

In a number of embodiments, the second-order harmonic series resonant circuit includes an inductor and a capacitor electrically connected in series between the output pad and the power low pin, and the inductor and the capacitor are configured to resonate at about two times the fundamental frequency. In some embodiments, the inductor of the second-order harmonic series resonant circuit includes a bondwire, and the capacitor of the second-order harmonic series resonant circuit includes an on-chip capacitor of the power amplifier die.

According to certain embodiments, the third-order harmonic series resonant circuit includes a printed inductor and a surface mount capacitor.

In various embodiments, the third-order harmonic parallel resonant circuit includes a printed inductor and an on-chip capacitor of the power amplifier die. In some embodiments, the on-chip capacitor of the power amplifier die is electrically connected to the output pad of the power amplifier die via an electrical path that includes a first bondwire and a second bondwire in series.

DETAILED DESCRIPTION OF EMBODIMENTS

The headings provided herein, if any, are for convenience only and do not necessarily affect the scope or meaning of the claimed invention.

Overview of Examples of Power Amplifier Systems

Figure 1:
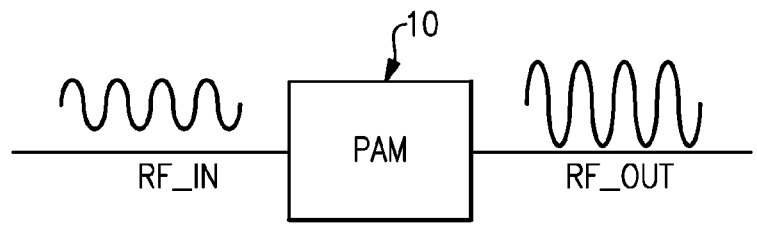
FIG. 1 is a schematic block diagram of a power amplifier module for amplifying a radio frequency (RF) signal.

FIG. 1 is a schematic block diagram of a power amplifier module for amplifying a radio frequency (RF) signal. The illustrated power amplifier module (PAM) 10 can be configured to amplify an RF signal RF_IN to generate an amplified RF signal RF_OUT. As described herein, the power amplifier module can include one or more power amplifiers.

Figure 2:
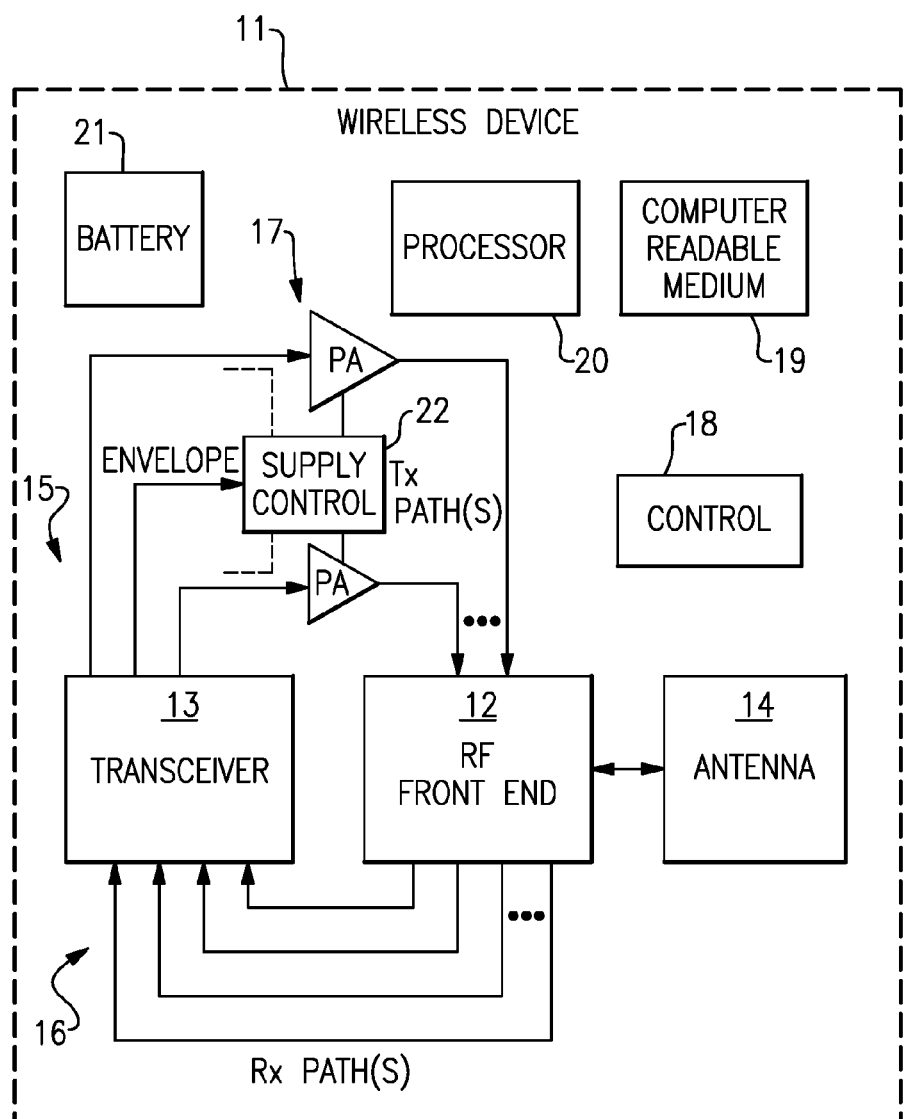
FIG. 2 is a schematic block diagram of an example wireless device that can include one or more of the power amplifier modules of FIG. 1.

FIG. 2 is a schematic block diagram of an example wireless or mobile device 11 that can include one or more of the power amplifier modules 10 of FIG. 1. The wireless device 11 can include power amplifiers implementing one or more features of the present disclosure.

The example wireless device 11 depicted in FIG. 2 can be a multi-band and/or multi-mode device such as a multi-band/multi-mode mobile phone. By way of examples, Global System for Mobile (GSM) communication standard is a mode of digital cellular communication that is utilized in many parts of the world. GSM mode mobile phones can operate at one or more of four frequency bands: 850 MHz (approximately 824-849 MHz for Tx, 869-894 MHz for Rx), 900 MHz (approximately 880-915 MHz for Tx, 925-960 MHz for Rx), 1800 MHz (approximately 1710-1785 MHz for Tx, 1805-1880 MHz for Rx), and 1900 MHz (approximately 1850-1910 MHz for Tx, 1930-1990 MHz for Rx). Variations and/or regional/national implementations of the GSM bands are also utilized in different parts of the world.

Code division multiple access (CDMA) is another standard that can be implemented in mobile phone devices. In certain implementations, CDMA devices can operate in one or more of 800 MHz, 900 MHz, 1800 MHz and 1900 MHz bands, while certain W-CDMA and Long Term Evolution (LTE) devices can operate over, for example, about 22 or more radio frequency spectrum bands.

One or more features of the present disclosure can be implemented in the foregoing example modes and/or bands, and in other communication standards. For example, 3G, 4G, LTE, and advanced LTE are non-limiting examples of such standards.

The illustrated wireless device 11 includes an RF front end 12, a transceiver 13, an antenna 14, power amplifiers 17, a control component 18, a computer readable medium 19, a processor 20, a battery 21, and a supply control block 22.

The transceiver 13 can generate RF signals for transmission via the antenna 14. Furthermore, the transceiver 13 can receive incoming RF signals from the antenna 14.

It will be understood that various functionalities associated with the transmission and receiving of RF signals can be achieved by one or more components that are collectively represented in FIG. 2 as the transceiver 13. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 2 as the antenna 14. For example, a single antenna can be configured to provide both transmitting and receiving functionalities. In another example, transmitting and receiving functionalities can be provided by separate antennas. In yet another example, different bands associated with the wireless device 11 can be provided with different antennas.

In FIG. 2, one or more output signals from the transceiver 13 are depicted as being provided to the antenna 14 via one or more transmission paths 15. In the example shown, different transmission paths 15 can represent output paths associated with different bands and/or different power outputs. For instance, the two example power amplifiers 17 shown can represent amplifications associated with different power output configurations (e.g., low power and high power), and/or amplifications associated with different bands. Although the configuration illustrated in FIG. 2 includes two transmission paths 15, the wireless device 11 can be adapted to include more or fewer transmission paths 15.

In FIG. 2, one or more detected signals from the antenna 14 are depicted as being provided to the transceiver 13 via one or more receiving paths 16. In the example shown, different receiving paths 16 can represent paths associated with different bands. For example, the four example paths 16 shown can represent quad-band capability that some wireless devices are provided with. Although the configuration illustrated in FIG. 2 includes four receiving paths 16, the wireless device 11 can be adapted to include more or fewer receiving paths 16.

To facilitate switching between receive and transmit paths, the RF front end 12 can be configured to electrically connect the antenna 14 to a selected transmit or receive path. Thus, the RF front end 12 can provide a number of switching functionalities associated with an operation of the wireless device 11. In certain embodiments, the RF front end 12 can include a number of switches configured to provide functionalities associated with, for example, switching between different bands, switching between different power modes, switching between transmission and receiving modes, or some combination thereof. The RF front end 12 can also be configured to provide additional functionality, including filtering of signals. For example, the RF front end 12 can include one or more duplexers.

FIG. 2 shows that in certain embodiments, a control component 18 can be provided, and such a component can be configured to provide various control functionalities associated with operations of the RF front end 12, the power amplifiers 17, the supply control block 22, and/or other operating component(s). Non-limiting examples of the control component 18 are described herein in greater detail.

In certain embodiments, a processor 20 can be configured to facilitate implementation of various control processes. In certain configurations, the processor 20 operates using computer program instructions, which can be stored in a computer-readable memory 19.

The illustrated wireless device 11 also includes the supply control block 22, which can be used to provide a power amplifier supply voltage to one or more of the power amplifiers 17. For example, the supply control block 22 can be an envelope tracker configured to control the voltage level of the power amplifier supply voltage based upon an envelope of an RF signal to be amplified by one or more of the power amplifiers. However, in certain embodiments the supply control block 22 can be other blocks, including, for example, a DC-to-DC converter.

The supply control block 22 can be electrically connected to the battery 21, and the supply control block 22 can control the voltage level of the supply voltage provided to the power amplifiers 17 based on an envelope of the RF signal to be amplified. The battery 21 can be any suitable battery for use in the wireless device 11, including, for example, a lithium-ion battery. As will be described in detail further below, by controlling the voltage level of the power amplifier supply voltage provided to the power amplifiers, the power consumption of the battery 21 can be reduced, thereby improving performance of the wireless device 11. As illustrated in FIG. 2, the envelope signal can be provided to the supply control block 22 from the transceiver 13. However, the envelope can be determined in other ways. For example, the envelope can be determined by detecting the envelope from the RF signal using any suitable envelope detector.

One technique for reducing power consumption of a power amplifier is envelope tracking, in which the voltage level of the supply voltage of the power amplifier is changed in relation to the envelope of the RF signal. For example, when the envelope of the RF signal increases the voltage level of the power amplifier's power supply can be increased. Likewise, when the envelope of the RF signal decreases the voltage level of the power amplifier's power supply can be decreased to reduce power consumption.

Figure 3:
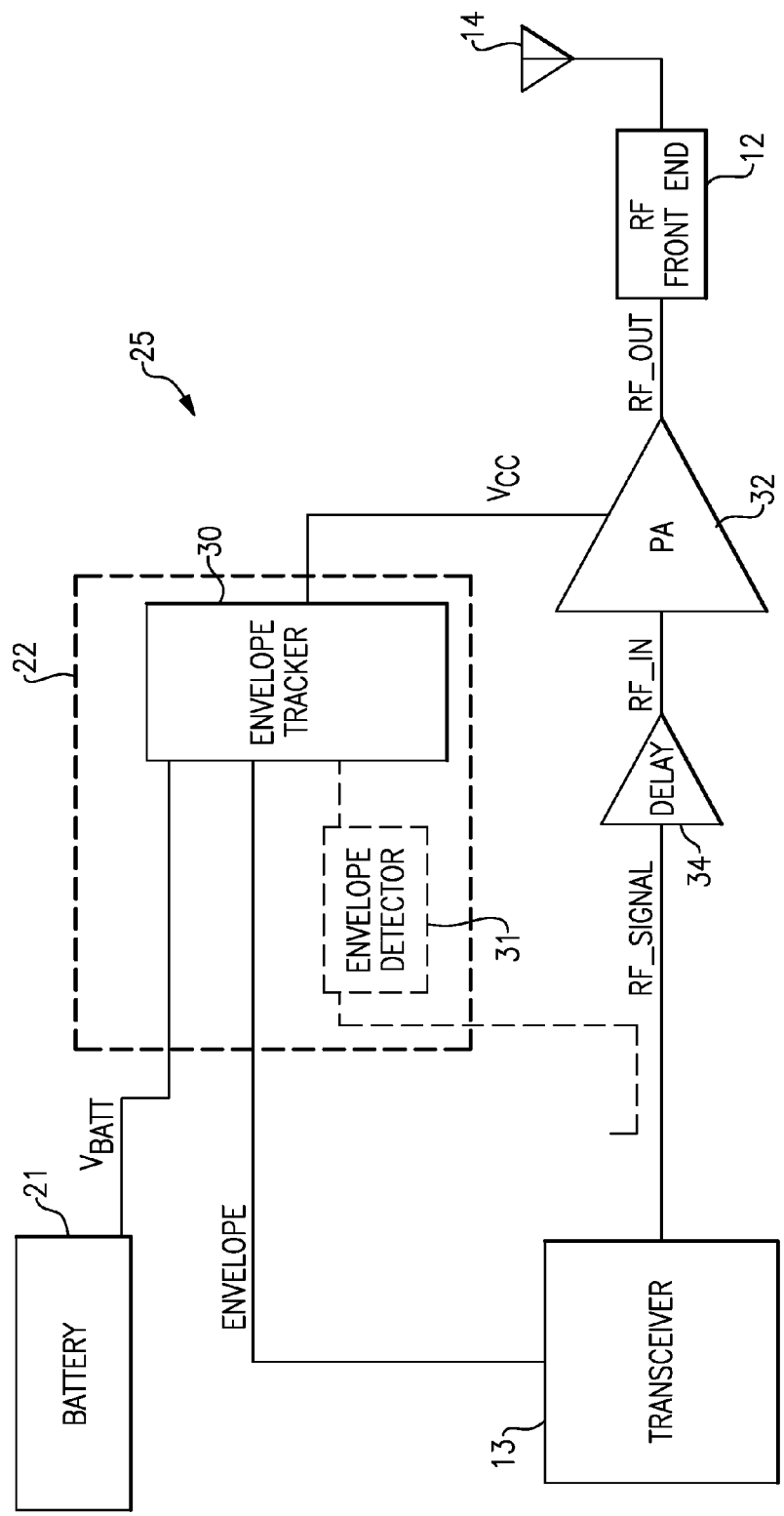
FIG. 3 is a schematic block diagram of one example of a power amplifier system including an envelope tracker.

FIG. 3 is a schematic block diagram of one example of a power amplifier system 25 including an envelope tracker 30. The illustrated power amplifier system 25 includes the RF front end 12, the transceiver 13, the antenna 14, the battery 21, a delay element 34, a power amplifier or PA 32, and a supply control block 22 including the envelope tracker 30. Although the illustrated supply control block 22 includes the envelope tracker 30, other implementations of the supply control block 22 can be used herein that omit the envelope tracker 30.

The transceiver 13 can generate a radio frequency signal RF_SIGNAL, and can provide the signal RF_SIGNAL to a delay element 34. The delay element 34 can delay the signal RF_SIGNAL to generate a signal RF_IN, which can be compensated for a delay in generating a power amplifier supply voltage $V_{CC}$ of the power amplifier 32. The power amplifier 32 can amplify the signal RF_IN to generate the signal RF_OUT, which can be provided to the antenna 14 through the RF front end 12. Although FIG. 3 illustrates a configuration using one power amplifier, additional power amplifiers can be electrically connected to the RF front end 12 to aid in providing a desired number of transmit paths. Additionally, although not shown in FIG. 3, the RF front end 12 can be adapted to include one or more receive paths.

The transceiver 13 can also generate the envelope signal ENVELOPE, which can correspond to the envelope of the signal RF_SIGNAL. The envelope tracker 30 is configured to receive a battery voltage $V_{BATT}$ from the battery 21 and the envelope signal ENVELOPE from the transceiver 13. The envelope tracker 30 can generate a power amplifier supply voltage or power high supply voltage $V_{CC}$, which the envelope tracker 30 can control based on the envelope signal ENVELOPE. For example, the envelope tracker 30 can increase a voltage level of the power amplifier supply voltage $V_{CC}$ when the envelope signal ENVELOPE increases, and can decrease a voltage level of the power amplifier supply voltage $V_{CC}$ when the envelope signal ENVELOPE decreases.

Although the transceiver 13 is illustrated as providing the envelope signal ENVELOPE to the envelope tracker 30, the envelope of the signal can be generated in any suitable manner. For example, an envelope detector 31 can be included to generate an envelope signal from the RF signal.

Figure 4A:
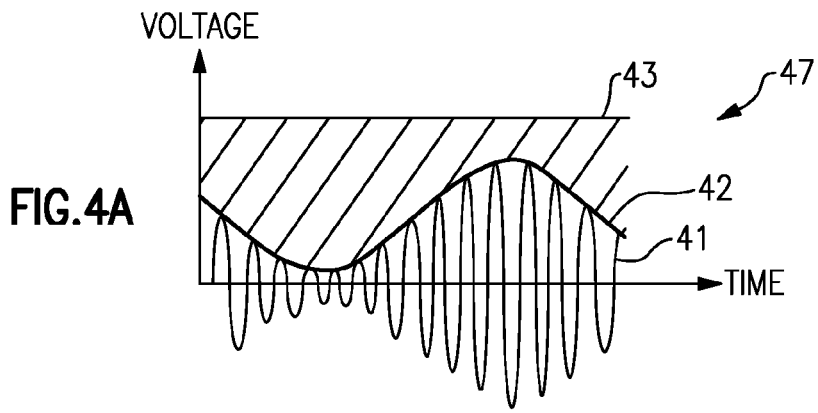
FIGS. 4A-4C show three examples of a power amplifier supply voltage versus time.
Figure 4B:
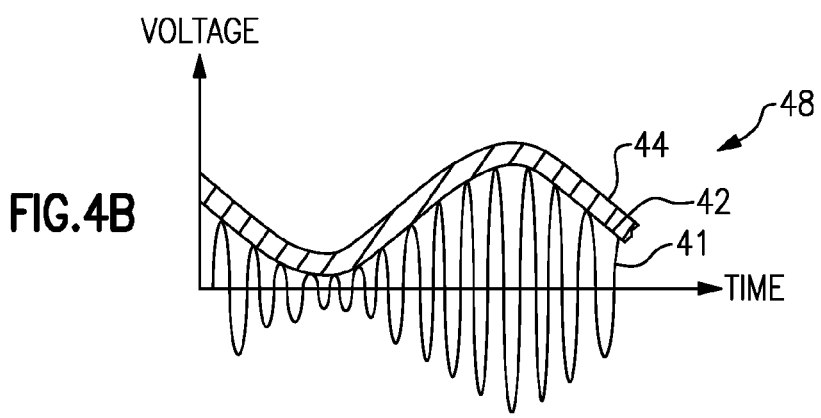
Figure 4C:
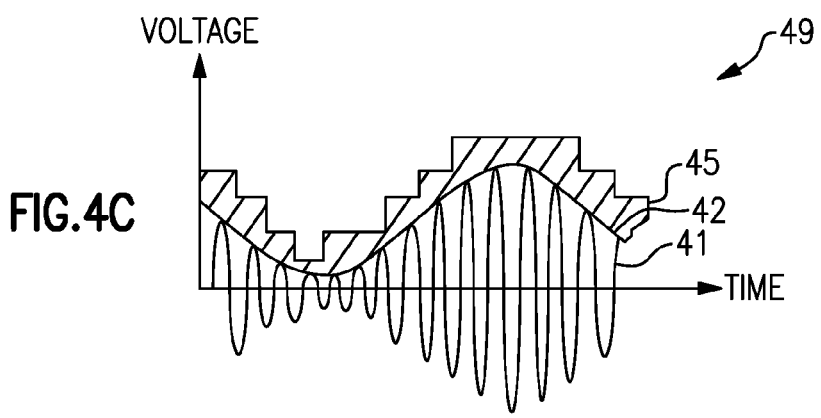

FIGS. 4A-4C show three examples of a power amplifier supply voltage versus time.

In FIG. 4A, a graph 47 illustrates the voltage of an RF signal 41 and a power amplifier supply voltage 43 versus time. The RF signal 41 has a signal envelope 42.

It can be important that the power amplifier supply voltage 43 of the power amplifier has a voltage level greater than that of the RF signal 41. For example, providing a supply voltage to a power amplifier having a magnitude less than that of the RF signal 41 can clip the signal, thereby creating signal distortion and/or other problems. Thus, it is important the power amplifier supply voltage 43 be greater than that of the signal envelope 42. However, it can be desirable to reduce a difference in voltage between the power amplifier supply voltage 43 and the signal envelope 42 of the RF signal 41, as the area between the power amplifier supply voltage 43 and the signal envelope 42 can represent lost energy, which can reduce battery life and increase heat generated in a mobile device.

In FIG. 4B, a graph 48 illustrates the voltage of an RF signal 41 and a power amplifier supply voltage 44 versus time. In contrast to the power amplifier supply voltage 43 of FIG. 4A, the power amplifier supply voltage 44 of FIG. 4B varies or changes in relation to the signal envelope 42. The area between the power amplifier supply voltage 44 and the signal envelope 42 in FIG. 4B is less than the area between the power amplifier supply voltage 43 and the signal envelope 42 in FIG. 4A, and thus the graph 48 of FIG. 4B can be associated with a power amplifier system having greater energy efficiency.

FIG. 4C is a graph 49 illustrating a power amplifier supply voltage 45 that varies or changes in relation to the signal envelope 42 of the RF signal 41. In contrast to the power amplifier supply voltage 44 of FIG. 4B, the power amplifier supply voltage 45 of FIG. 4C changes in discrete voltage increments. Certain implementations described herein can be used in combination with supply voltage modules that change a power amplifier supply voltage continuously or in discrete increments.

Although FIGS. 4A-4C illustrate three examples of power amplifier supply voltage versus time the teachings herein are applicable to other configurations of power supply generation. For example, the teachings herein are applicable to configurations in which a supply voltage module limits a minimum voltage level of the power amplifier supply voltage.

Figure 5:
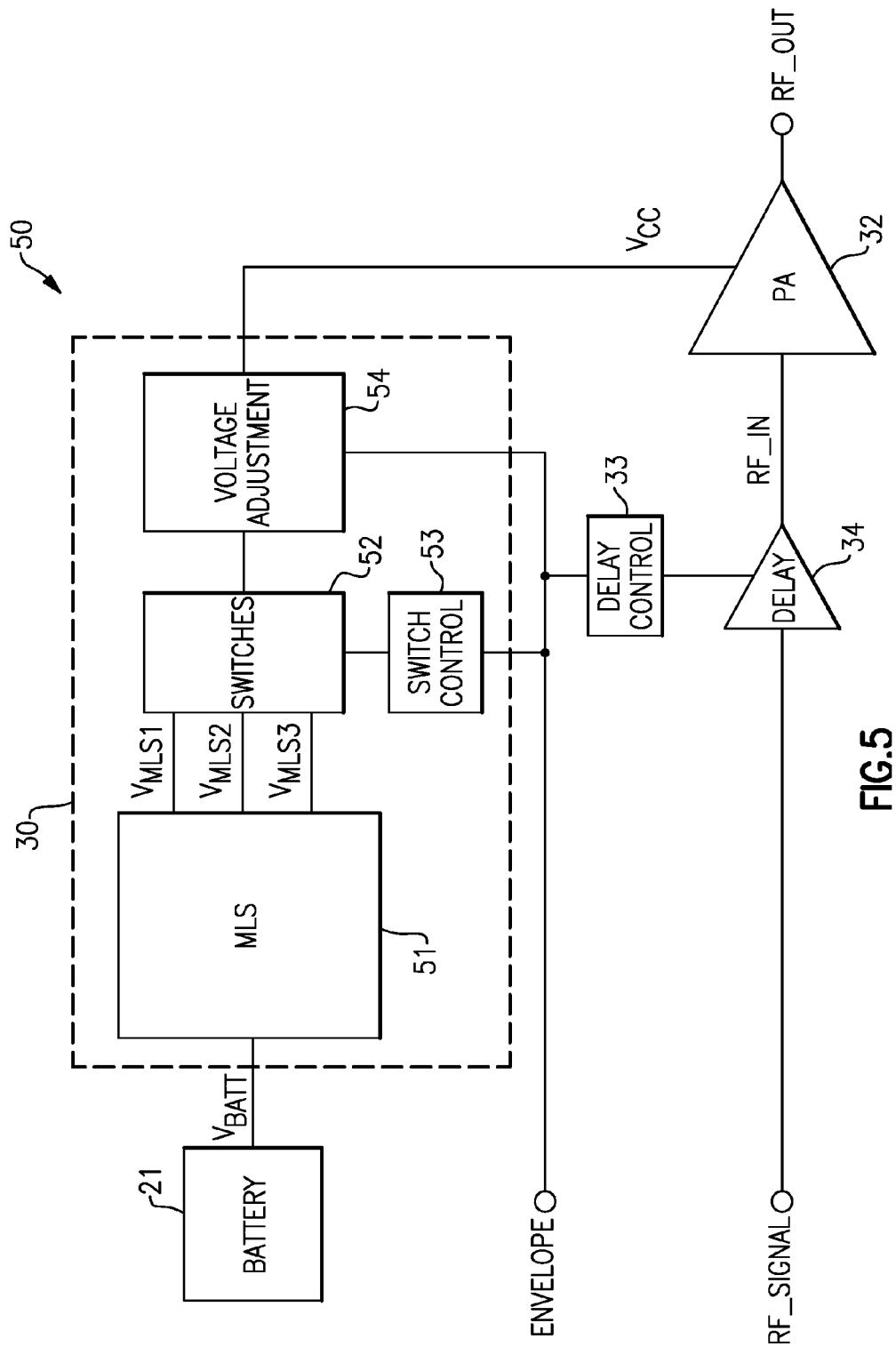
FIG. 5 is a schematic block diagram of another example of a power amplifier system including an envelope tracker.

FIG. 5 is a schematic block diagram of another example of a power amplifier system 50 including an envelope tracker 30. The illustrated power amplifier system 50 includes the battery 21, the envelope tracker 30, the power amplifier 32, the delay block 34, and a delay control block 33. The envelope tracker 30 includes a multi-level supply block 51, switches 52, a switch control block 53, and a voltage adjustment block 54.

As shown in FIG. 5, the example power amplifier system 50 can receive the signal RF_SIGNAL and the envelope signal ENVELOPE. The envelope tracker 30 can use the envelope signal ENVELOPE to control a voltage level of a power amplifier supply voltage $V_{CC}$ of the power amplifier 32. In order to compensate for delays in generating the power amplifier supply voltage $V_{CC}$, the delay block 34 can delay the signal RF_SIGNAL to generate a signal RF_IN, which can be aligned to the power amplifier supply voltage $V_{CC}$. The delay control block 33 can be used to control the delay of the delay block 34. In certain implementations, the delay control block 33 can adjust the delay of the delay block 34 based at least partly on the envelope signal ENVELOPE.

The power amplifier 32 can amplify the signal RF_IN to generate a signal RF_OUT. In certain implementations, the power amplifier 32 is a multi-stage power amplifier including at least a first or input stage and a second or output stage cascaded to achieve an overall desired power amplification. In such implementations, the envelope tracker 32 can be used, for example, to power both the input and output stages or to power the output stage but not the input stage.

To aid in providing a high-efficiency supply voltage for the power amplifier 32, the illustrated power amplifier system includes a multi-level supply block 51 configured to generate several DC power supply voltages using a battery voltage $V_{BATT}$ generated by the battery 21. For example, the multi-level supply block 51 can be used to generate power supply voltages $V_{MLS1}$, $V_{MLS2}$ and $V_{MLS3}$ from the battery voltage $V_{BATT}$. Although the multi-level supply block 51 is illustrated as generating three power supply voltages, the multi-level supply block 51 can be configured to generate more or fewer power supply voltages.

The switch control block 53 can be configured to use the switches 52 to select amongst the power supply voltages generated by the multi-level supply block 51, and the power supply voltage selected by the switch control block 53 can be adjusted by a voltage adjustment block 54 to generate the power amplifier supply voltage $V_{CC}$ for the power amplifier 32. In certain implementations, the voltage adjustment block 54 includes one or more linear amplifiers for amplifying an error between the envelope signal ENVELOPE and the power amplifier supply voltage $V_{CC}$ generated by the envelope tracker 30.

By providing both the multi-level supply block 51 and the voltage adjustment block 54, constraints on the design of the power amplifier system can be reduced, thereby permitting a system with greater flexibility and improved power efficiency.

Overview of Examples of Power Amplifier Output Matching Circuits

A power amplifier system using a supply voltage modulation scheme such as envelope tracking or average power tracking (APT) can have improved power performance associated with controlling the power amplifier supply voltage over time. For example, power amplifier systems including supply voltage modulation can exhibit higher power added efficiency (PAE) and/or lower thermal dissipation, which can be important for multi-band/multi-mode wireless device implementations, such as smart phone devices configured to operate using 3G and 4G.

Conventional power amplifier output matching circuits may not provide sufficient performance for operation in power amplifier systems employing supply voltage modulation. For example, conventional power amplifier output matching circuits may not be power efficient over a wide range of operating conditions, including at back-off power levels. Moreover, such output matching circuits may not provide harmonic suppression sufficient to maintain stability, harmonic rejection, and/or band-to-band interference rejection of the power amplifier system under varying voltage standing wave ratio (VSWR).

Power amplifier output matching circuits are provided herein. The output matching circuits provide high efficiency at peak saturation for a variety of supply voltage levels, thereby improving performance when used in a power amplifier system that includes a supply control block such as an envelope tracker that changes the power amplifier's supply voltage over time. Additionally, the output matching circuits provide low supply voltage capacitive loading and high efficiency at back-off power levels. The output matching circuits can provide robust harmonic suppression by providing termination at least at second and third harmonic frequencies.

In certain implementations, an output matching circuit includes a supply voltage biasing circuit electrically connected between an input node and a power high supply voltage, a second-order harmonic series resonant circuit electrically connected between the input node and a power low supply voltage, a third-order harmonic parallel resonant circuit electrically connected between the input node and a harmonic frequency grounding node, a third-order harmonic series resonant circuit electrically connected between the harmonic frequency grounding node and the power low supply voltage, and a DC blocking capacitor electrically connected between the harmonic frequency grounding node and an output node.

A power amplifier can drive the input node of the output matching circuit, and the output matching circuit can suppress harmonic frequency signal components of the amplified RF signal generated by the power amplifier. For example, the second-order harmonic series resonant circuit can reduce or eliminate second-order harmonic frequency signal components by providing a low impedance path for second-order harmonic frequency signal components to the power low supply voltage. Additionally, the third-order harmonic series resonant circuit and the third-order harmonic parallel resonant circuit can operate to prevent third-order harmonic frequency signal components from reaching the output node of the output matching circuit. Furthermore, the supply voltage biasing circuit can be used to power the power amplifier driving the input node, and the DC blocking capacitor can provide DC blocking and/or an impedance transformation to help achieve a desired load line impedance of the power amplifier at the fundamental frequency.

FIGS. 6A-6D are circuit diagrams of power amplifier systems including output matching circuits according to various embodiments.

Figure 6A:
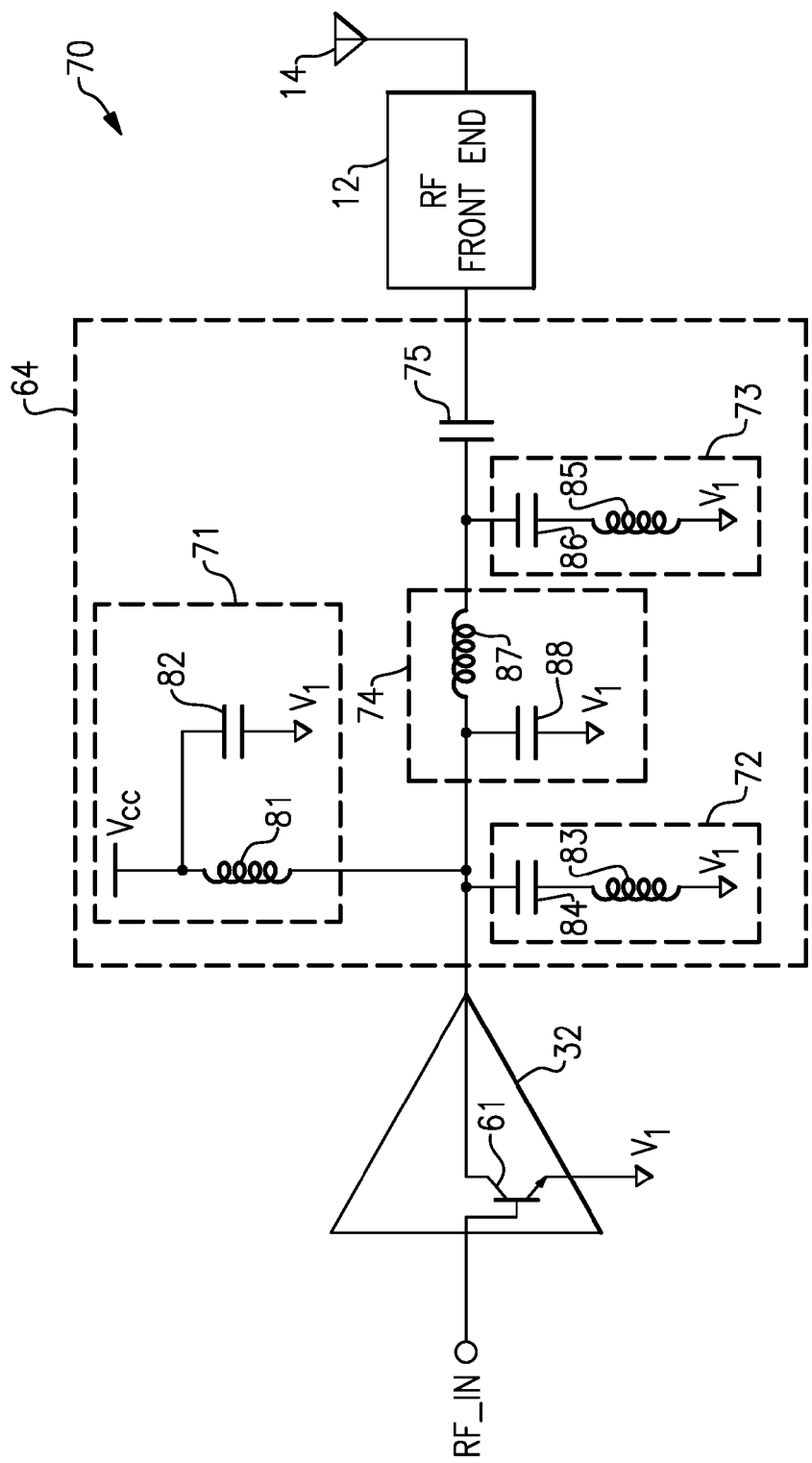
FIGS. 6A-6D are circuit diagrams of power amplifier systems including output matching circuits according to various embodiments.

FIG. 6A is a circuit diagram of a power amplifier system 70 including an output matching circuit 64 according to one embodiment. The power amplifier system 70 includes the RF front end 12, the antenna 14, the power amplifier 32, and the output matching circuit 64. The power amplifier 32 includes an input configured to receive a radio frequency signal RF_IN and an output electrically connected to an input node of the output matching circuit 64. The output matching circuit 64 further includes an output node electrically connected to an input of the RF front end 12. The RF front end 12 includes an output electrically connected to the antenna 14.

The illustrated power amplifier 32 includes a bipolar transistor 61 having an emitter, a base, and a collector. The emitter of the bipolar transistor 61 is electrically connected to a power low supply voltage $V_1$, which can be a ground supply, and the base of the bipolar transistor 61 is configured to receive the signal RF_IN. The bipolar transistor 61 can amplify the signal RF_IN, and provide the amplified signal at the collector, which operates as the output of the power amplifier 32. The bipolar transistor 61 can be any suitable device. In one implementation, the bipolar transistor 61 is a heterojunction bipolar transistor (HBT).

Although FIG. 6A illustrates one implementation of the power amplifier 32, the teachings described herein can be applied to a variety of power amplifier structures, including, for example, multi-stage power amplifier structures and/or power amplifiers employing other transistor types, including, for example, field-effect transistors.

The output matching circuit 64 includes a supply voltage biasing circuit 71, a second-order harmonic series resonant circuit 72, a third-order harmonic series resonant circuit 73, a third-order harmonic parallel resonant circuit 74, and a DC blocking capacitor 75. The supply voltage biasing circuit 71 is electrically connected between the power high supply voltage $V_{CC}$ and the input node, and the second-order harmonic series resonant circuit 72 is electrically connected between the input node and the power low supply voltage $V_1$. The third-order harmonic parallel resonant circuit 74 is electrically connected between the input node and a harmonic frequency grounding node, and the third-order harmonic series resonant circuit 73 is electrically connected between the harmonic frequency grounding node and the power low supply voltage $V_1$. Additionally, the DC blocking capacitor 75 is electrically connected between the harmonic frequency grounding node and the output node of the output matching circuit 64.

The supply voltage biasing circuit 71 can be used to bias the power amplifier 32 with the power high supply voltage $V_{CC}$, which in certain implementations is generated by an envelope tracker or other supply control block. The supply voltage biasing circuit 71 includes a first inductor 81 and a first capacitor 82. The first or choke inductor 81 includes a first end electrically connected to the power high supply voltage $V_{CC}$ and a second end electrically connected to the collector of the bipolar transistor 61 at the output of the power amplifier 32. The choke inductor 81 can have an inductance sufficient to block RF signals generated by the power amplifier 32 from reaching the power high supply voltage $V_{CC}$. However, the choke inductor 81 should be sized to minimize L*dI/dt effects associated with receiver band noise, which can degrade performance in envelope tracking applications. The first or decoupling capacitor 82 includes a first end electrically connected to the power high supply voltage $V_{CC}$ and a second end electrically connected to the power low supply voltage $V_1$, and can perform a wide variety of functions. For example, including the decoupling capacitor 82 can reduce noise of the power high supply voltage $V_{CC}$ and/or stabilize the output of the power amplifier 32. Additionally, the decoupling capacitor 82 can be used to provide an RF/AC ground to the second end of the choke inductor 81.

In one embodiment, the choke inductor 81 has an inductance in the range of about 1 nH to about 6 nH and the decoupling capacitor 82 has a capacitance in the range of about 0 pF (omitted) to about 200 pF. However, persons having ordinary skill in the art will readily ascertain other suitable inductance and capacitance values, such as inductance and capacitance values associated with optimum load impedance and/or operating frequency.

The second-order harmonic series resonant circuit 72 can be configured to resonate at about two times the fundamental frequency of the signal RF_IN so as to short second-order harmonic frequency signal components in the power amplifier's output signal. In the illustrated configuration, the second-order harmonic series resonant circuit 72 includes a second inductor 83 and a second capacitor 84 electrically connected in series between the power low supply voltage $V_1$ and the collector of the bipolar transistor 61. Although the second-order harmonic series resonant circuit 72 illustrates one configuration of the second-order harmonic series resonant circuit, other configurations can be used, including, for example, implementations in which the order of the second inductor 83 and the second capacitor 84 in the series is reversed.

In one embodiment, the second inductor 83 and the second capacitor 84 are configured to resonate such that the impedance of the second-order harmonic series resonant circuit 72 at two times the fundamental frequency of the signal RF_IN is less than about 0.7Ω. In another embodiment, the second inductor 83 and the second capacitor 84 are configured to resonate such that the impedance of the second-order harmonic series resonant circuit 72 at two times the fundamental frequency of the signal RF_IN is less than about 25% of a load line impedance of the output matching circuit 64.

The third-order harmonic series resonant circuit 73 can be configured to resonate at about three times the fundamental frequency of the signal RF_IN so as to provide a low impedance path between the harmonic frequency grounding node and the power low supply voltage $V_1$ at about three times the fundamental frequency. For example, the third-order harmonic series resonant circuit 73 can be used to provide RF ground at the harmonic frequency grounding node for signals having a frequency of about three times the fundamental frequency. In the illustrated configuration, the third-order harmonic series resonant circuit 73 includes a third inductor 85 and a third capacitor 86 electrically connected in series between the power low supply voltage $V_1$ and the harmonic frequency grounding node. Although the third-order harmonic series resonant circuit 73 illustrates one configuration of the third-order harmonic series resonant circuit, other configurations can be used, including, for example, implementations in which the order of the third inductor 85 and the third capacitor 86 are reversed in the series.

In one embodiment, the third inductor 85 and the third capacitor 86 are configured to resonate such that the impedance of the third-order harmonic series resonant circuit 73 at three times the fundamental frequency of the signal RF_IN is less than about 0.7Ω.

The third-order harmonic parallel resonant circuit 74 includes a fourth inductor 87 and a fourth capacitor 88, which can be configured to resonate at about three times the fundamental frequency of the signal RF_IN. The fourth inductor 87 is electrically connected between the collector of the bipolar transistor 61 and the harmonic frequency grounding node, and the fourth capacitor 88 is electrically connected between the collector of the bipolar transistor 61 and the power low supply voltage $V_1$.

The harmonic frequency grounding node can operate as an RF ground for signals at about three times the fundamental frequency of the signal RF_IN. Accordingly, the fourth inductor 87 and the fourth capacitor 88 can be electrically connected in parallel between the output of the power amplifier 32 and RF ground for signal components that are at about three times the fundamental frequency. Thus, the third-order harmonic parallel resonant circuit 74 can be used to block third-order harmonic frequency components generated by the output signal of the power amplifier 32 from reaching the output node of the output matching circuit 64.

The third-order harmonic parallel resonant circuit 74 can improve the third-order harmonic rejection of the power amplifier 32 by providing high impedance to signals at about three times the fundamental frequency of the signal RF_IN. Additionally, the capacitor 88 of the third-order harmonic parallel resonant circuit 74 can improve the performance of the power amplifier system 70 when a supply control block such as an envelope tracker is used to generate the power high supply voltage $V_{CC}$. For example, since the collector-emitter junction capacitance of the bipolar transistor 61 can change with biasing conditions, the capacitor 88 can help reduce variation in the capacitance between the collector of the bipolar transistor 61 and the power low supply voltage $V_1$ for voltage changes in the power high supply voltage $V_{CC}$. Thus, the illustrated output matching circuit 64 can improve overall performance of the power amplifier system 70 in implementations in which the power high supply voltage $V_{CC}$ is generated using an envelope tracker that changes the voltage level of the power high supply voltage $V_{CC}$ over time in relation to the envelope of the signal RF_IN.

In one embodiment, the fourth inductor 87 and the fourth capacitor 88 are configured to resonate such that the impedance of the third-order harmonic parallel resonant circuit 74 at three times the fundamental frequency of the signal RF_IN is greater than about 10Ω. In another embodiment, the fourth inductor 87 and the fourth capacitor 88 are configured to resonate such that the impedance of the third-order harmonic parallel resonant circuit 74 at three times the fundamental frequency of the signal RF_IN is greater than about three times a load line impedance of the output matching circuit 64.

The output matching circuit 64 further includes the DC blocking capacitor 75, which is electrically connected between the harmonic frequency grounding node and the output node of the output matching circuit 64. The DC blocking capacitor 75 can provide DC blocking and/or help provide an impedance transformation to achieve a desired load line impedance of the power amplifier 32 at the fundamental frequency. For example, in certain implementations the DC blocking capacitor 75 can be used at least in part to transform a termination impedance associated with the RF front end 12, such as a 50Ω termination impedance, to a load line impedance that is desirable for the power amplifier 32 from a power efficiency standpoint. Additionally, the DC blocking capacitor 75 can block DC signals, thereby helping to provide DC bias voltage isolation between the output of the power amplifier 32 and the input of the RF front end 12. Although FIG. 6A illustrates a configuration including the DC blocking capacitor 75, in certain implementations the DC blocking capacitor 75 can be omitted, such as in implementations using a surface acoustic wave (SAW) filter.

Although the output matching circuit 64 has been illustrated in the context of one example of a power amplifier system, the output matching circuit 64 can be used in other configurations of power amplifier systems.

Figure 6B:
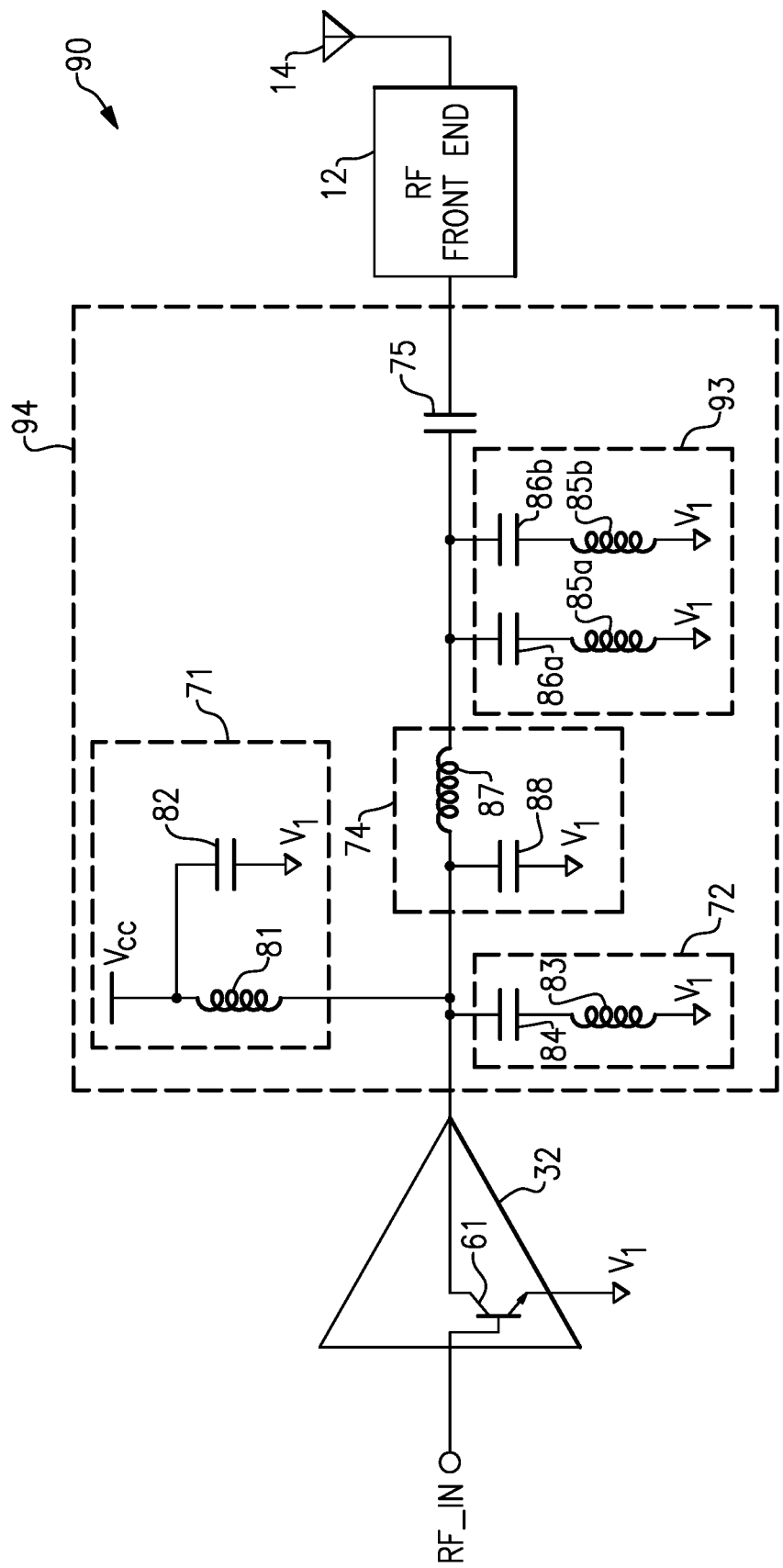

FIG. 6B is a circuit diagram of a power amplifier system 90 including an output matching circuit 94 according to another embodiment. The output matching circuit 94 of FIG. 6B is similar to the output matching circuit 64 of FIG. 6A, except that the output matching circuit 94 includes a different arrangement of a third-order harmonic series resonant circuit.

In particular, the third-order harmonic series resonant circuit 93 of FIG. 6B has been implemented using a first series subcircuit including a first capacitor 86a and a first inductor 85a and a second series subcircuit including a second capacitor 86b and a second inductor 85b. In certain implementations, a resonance of the first capacitor 86a and the first inductor 85a is offset relative to a resonance of the second capacitor 86b and the second inductor 85b so as to broaden a frequency notch of the third-order harmonic series resonant circuit 93 near the third harmonic. Although FIG. 6B illustrates a configuration in which the third-order harmonic series resonant circuit 93 is implemented using two series subcircuits of capacitors and inductors, additional series subcircuits of capacitors and inductors can be used to provide a broader third harmonic notch. Furthermore, in certain implementations the second-order harmonic series resonant circuit 72 can be additionally or alternatively implemented using multiple series subcircuits of inductors and capacitors.

Figure 6C:
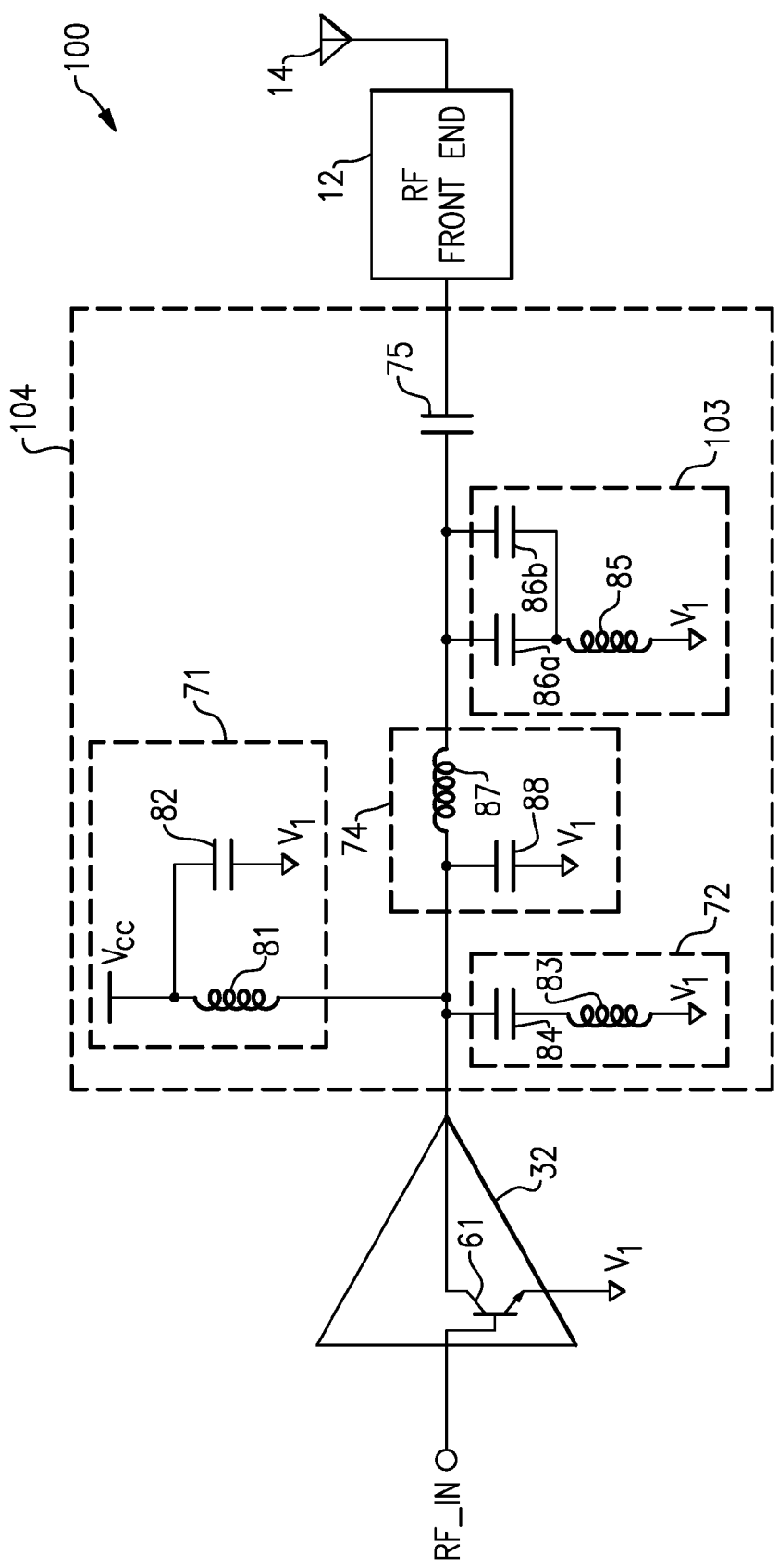

FIG. 6C is a circuit diagram of a power amplifier system 100 including an output matching circuit 104 according to another embodiment. The output matching circuit 104 of FIG. 6C is similar to the output matching circuit 64 of FIG. 6A, except that the output matching circuit 104 includes a different arrangement of a third-order harmonic series resonant circuit. In particular, the third-order harmonic series resonant circuit 103 of FIG. 6C has been implemented by connecting the first and second capacitors 86a, 86b in parallel to form a parallel subcircuit, and by connected the parallel subcircuit in series with the inductor 85. Although the third-order harmonic series resonant circuit 103 illustrates a parallel subcircuit of two capacitors provided in series with the inductor 85, additional capacitors can be provided in the parallel subcircuit. Furthermore, in certain implementations the second-order harmonic series resonant circuit 72 can be additionally or alternatively implemented in a similar configuration.

Figure 6D:
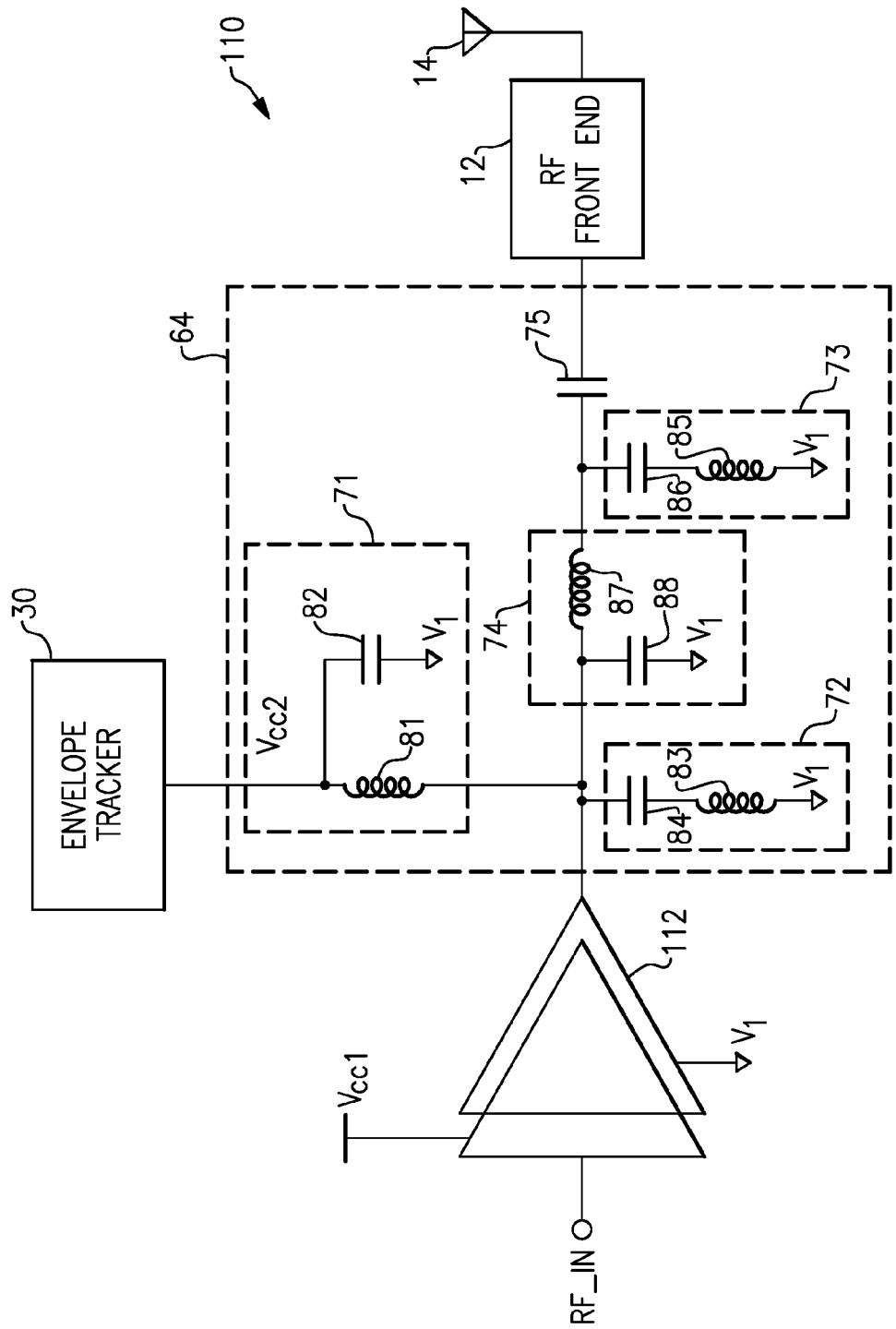

FIG. 6D is a circuit diagram of another embodiment of a power amplifier system 100. The power amplifier system 100 includes the output matching circuit 64, a power amplifier 112, and the envelope tracker 32. The power amplifier 112 is a multistage power amplifier including at least an input stage and an output stage. As shown in FIG. 6D, the input stage is powered using a first power amplifier supply voltage $V_{CC1}$ and the output stage is powered using a second power amplifier supply voltage $V_{CC2}$. As shown in FIG. 6D, the second power amplifier supply voltage $V_{CC2}$ is generated using the envelope tracker 30, and the first power amplifier supply voltage $V_{CC1}$ is a DC supply, such as a battery voltage.

Although FIG. 6D illustrates one example of a power supply scheme for a power amplifier system, other configurations are possible, including, for example, implementations in which the first power amplifier supply voltage $V_{CC1}$ and the second power amplifier supply voltage $V_{CC2}$ are connected to one another and generated by the envelope tracker 30. Additional implementations for connecting the first and second power amplifier supply voltages $V_{CC1}$, $V_{CC2}$ can be similar to those described further below with reference to FIGS. 8A-8C.

Figure 7A:
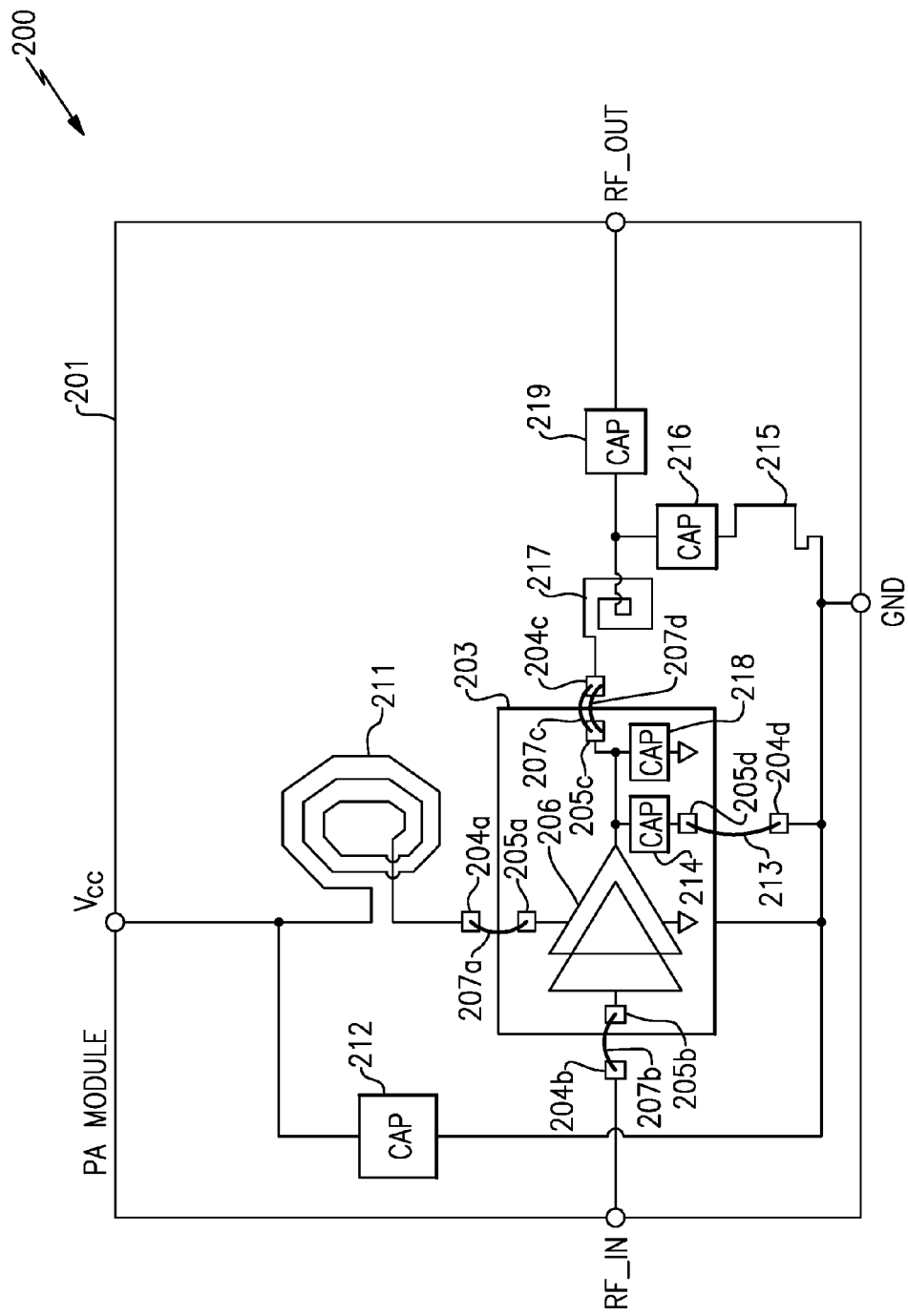
FIGS. 7A-7C are schematic diagrams of power amplifier modules including output matching circuits according to various embodiments.
Figure 7B:
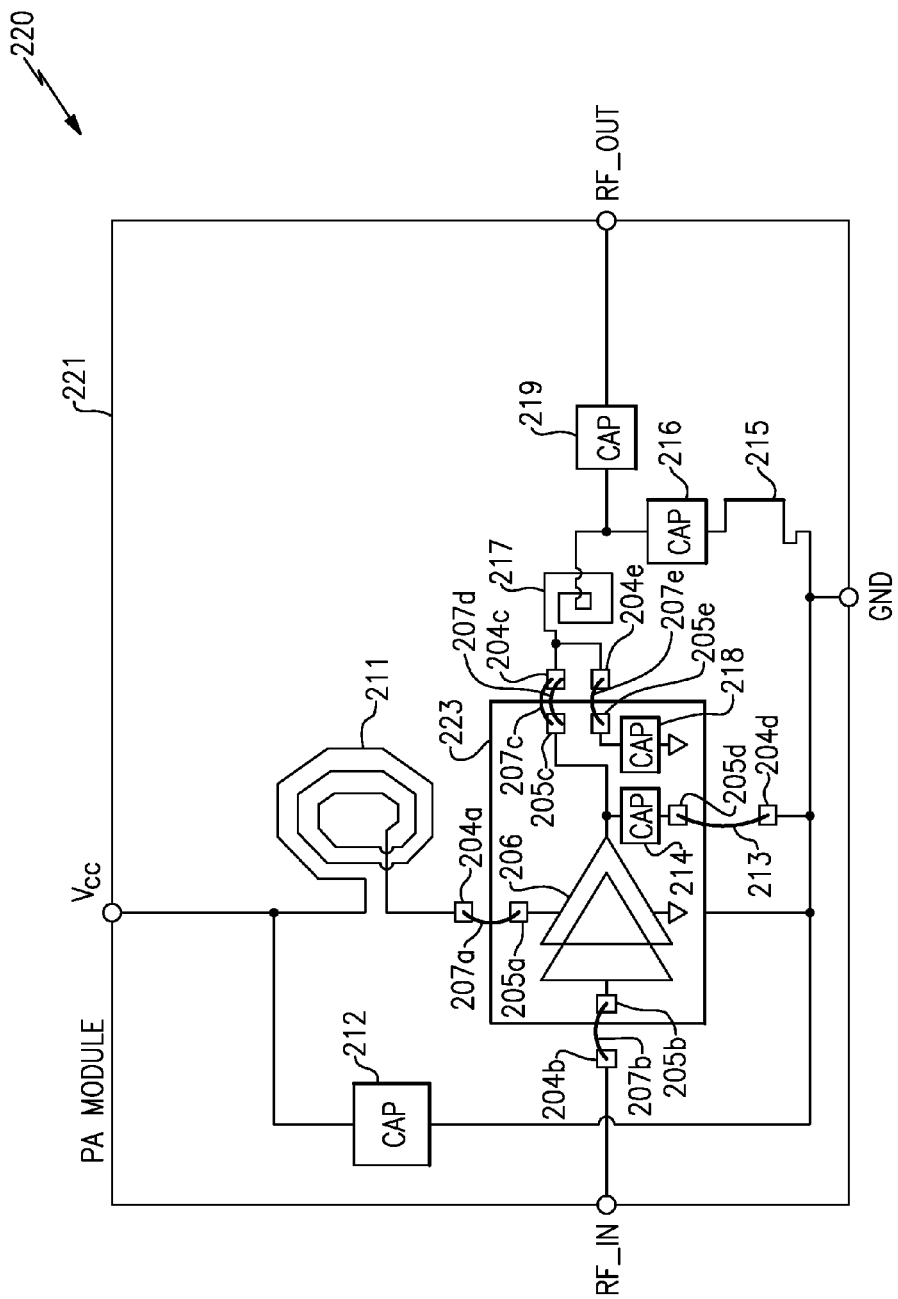
Figure 7C:
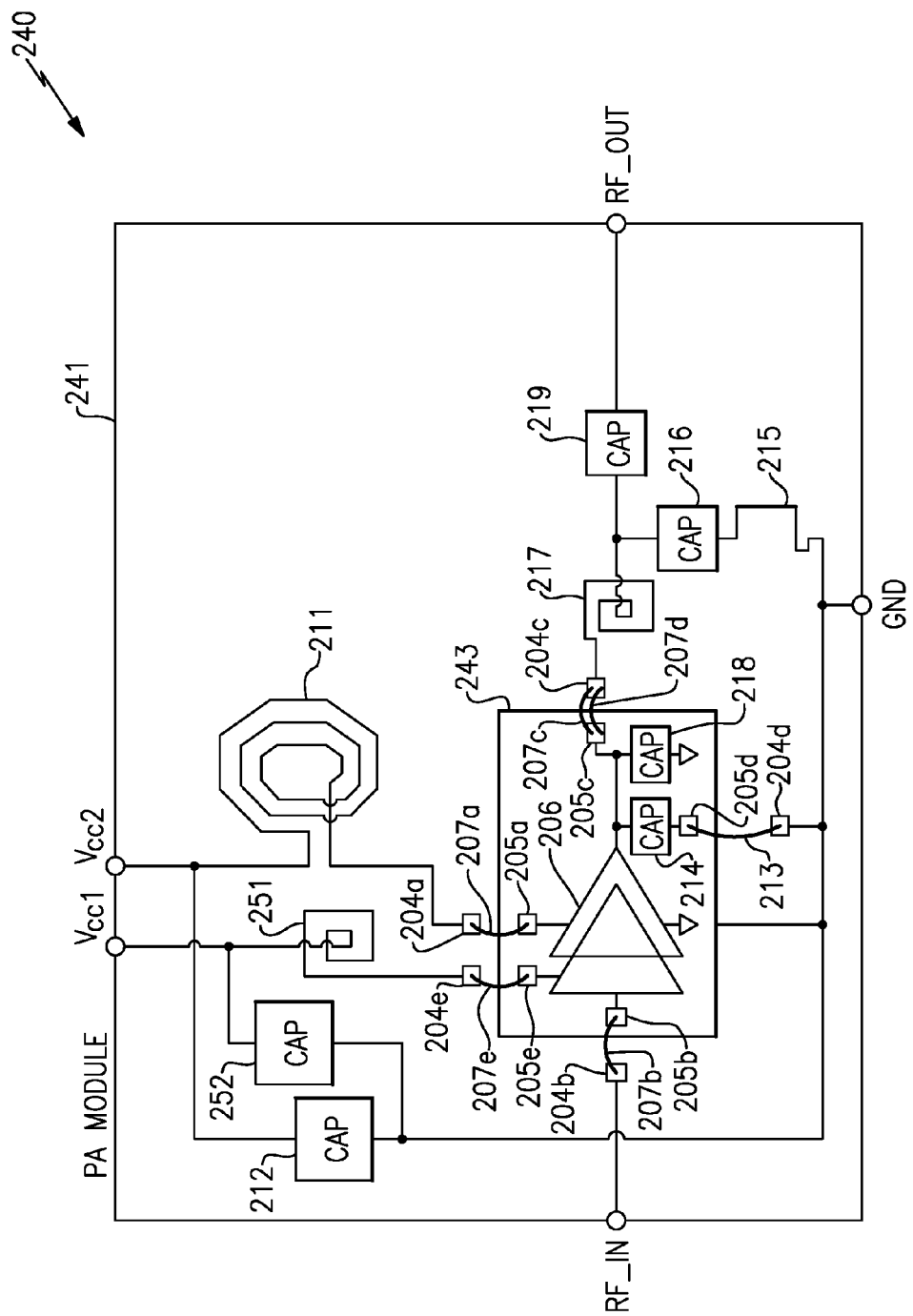

FIGS. 7A-7C are schematic diagrams of power amplifier modules including output matching circuits according to various embodiments.

FIG. 7A is a schematic diagram of a power amplifier module 200 including an output matching circuit according to one embodiment. The illustrated power amplifier module 200 is a multi-chip module (MCM) that includes a carrier or package substrate 201, a power amplifier die 203, a first surface mount capacitor 212, a second surface mount capacitor 216, a third surface mount capacitor 219, a first printed or spiral inductor 211, a second printed inductor 215, and a third printed inductor 217. The power amplifier module 200 further includes a first or power high pin $V_{CC}$, a second or power low pin GND, a third or input pin RF_IN, and a fourth or output pin RF_OUT. In certain implementations, the power high pin $V_{CC}$ is configured to receive a power amplifier supply voltage from an envelope tracking module disposed on a phone board. Although not illustrated in FIG. 7A for clarity, the power amplifier module 200 can include additional pins, dies and/or other components.

The carrier substrate 201 can be a multi-layer substrate configured to support electrical components and to provide electrical connectivity to external circuitry when the power amplifier module 200 is attached to a phone board. In the illustrated configuration, the power amplifier die 203 and the first to third surface mount capacitors 212, 216, 219 have been mounted to the carrier substrate 201. The carrier substrate 201 includes pads, such as the first to fourth pads 204a-204d, as well as traces used to provide electrical connections within the power amplifier module 200. In the illustrated configuration, portions of trace of the carrier substrate 201 have also been configured operate as the printed inductors 211, 215, 217.

The power high pin $V_{CC}$ is electrically connected to a first end of the first surface mount capacitor 212 and to a first end of the first printed inductor 211. The first printed inductor 211 further includes a second end electrically connected to the first pad 204a. The power low pin GND is electrically connected to a second end of the first surface mount capacitor 212 to a backside conductor of the power amplifier die 203, to the fourth pad 204d, and to a first end of the second printed inductor 215. The second printed inductor 215 further includes a second end electrically connected to a first end of the second surface mount capacitor 216. The second surface mount capacitor 216 further includes a second end electrically connected to a first end of the third printed inductor 217 and to a first end of the third surface mount capacitor 219. The third printed inductor 217 further includes a second end electrically connected to the third pad 204c. The input pin RF_IN is electrically connected to the second pad 204b, and the output pin RF_OUT is electrically connected to a second end of the third surface mount capacitor 219.

The illustrated power amplifier die 203 includes first to fourth pads 205a-205d, a power amplifier circuit 206, a first on-chip capacitor 214, and a second on-chip capacitor 218. The power amplifier die 203 further includes a backside conductor and one or more through wafer vias (TWVs) for providing connections between the die's circuitry and the backside conductor. The power amplifier circuit 206 includes a power high input electrically connected to the first pad 205a and a power low input electrically connected to the power low pin GND using the one or more TWVs and the backside conductor. The power amplifier circuit 206 further includes a signal input electrically connected to the second pad 205b and a signal output electrically connected to the third pad 205c, to a first end of the first on-chip capacitor 214, and to a first end of the second on-chip capacitor 218. The first on-chip capacitor 214 further includes a second end electrically connected to the fourth pad 205d. The second on-chip capacitor 218 further includes a second end electrically connected to the power low pin GND using the one or more TWVs and the backside conductor. Although not illustrated in FIG. 7A for clarity, the power amplifier die 203 can be adapted to include additional circuitry and/or pads. The power amplifier die 203 can be any suitable die. In one implementation, the power amplifier die 203 is a gallium arsenide (GaAs) die having transistors formed using a heterojunction bipolar transistor (HBT) process.

Bond wires have been used to electrically connect the pads 205a-205d of the power amplifier die 203 to the pads 204a-204d of the carrier substrate 201. For example, a first bond wire 207a has been used to electrically connect the pad 204a to the pad 205a, a second bond wire 207b has been used to electrically connect the pad 204b to the pad 205b, third and fourth bond wires 207c, 207d have been used to electrically connect the pad 204c to the pad 205c, and a fifth bond wire 213 has been used to electrically connect the pad 204d to the pad 205d. In certain implementations, the fifth bond wire 213 has an inductance that is greater than an inductance of each of the first to fourth bond wires 207a-207d. As shown in FIG. 7A, in certain implementations the increased inductance of the fifth bond wire 213 can be realized by making the fifth bond wire 213 longer than each of the first to fourth bond wires 207a-207d.

In the illustrated configuration, multiple bond wires have been used to provide the connection between the pad 204c and the pad 205c. Connecting pads using multiple bondwires can provide a connection having reduced inductance relative to a connection using a single bondwire of similar length. Although the connection between the pad 204c and the pad 205c is illustrated as including two bond wires, more or fewer bond wires can be used. Additionally, although only the signal output of the power amplifier circuit 206 is illustrated as being connected to the carrier substrate 201 using multiple wirebonds, in certain configurations other pads of the power amplifier die 203 can be connected to the carrier substrate 201 using multiple wirebonds.

The power amplifier module 200 illustrates one implementation of the output matching circuit 64 of FIG. 6A. For example, with reference to FIGS. 6A and 7A, the first printed inductor 211 can correspond to the first inductor 81, the first surface mount capacitor 212 can correspond to the first capacitor 82, the bond wire 213 can correspond to the second inductor 83, the first on-chip capacitor 214 can correspond to the second capacitor 84, the second printed inductor 215 can correspond to the third inductor 85, the second surface mount capacitor 216 can correspond to the third capacitor 86, the third printed inductor 217 can correspond to the fourth inductor 87, the second on-chip capacitor 218 can correspond to the fourth capacitor 88, and the third surface mount capacitor 219 can correspond to the DC blocking capacitor 75.

Although FIG. 7A illustrates one implementation of the output matching circuit 64 of FIG. 6A, other configurations of the output matching circuit 64 can be used, including, for example, implementations in which the inductors and capacitors are realized using a different combination of surface mount components, on-chip components, and/or printed components formed using the carrier substrate 201. Furthermore, the teachings herein are applicable to other configurations of the power amplifier die 203, including, for example, flip-chip configurations. Additionally, power amplifier modules can include output matching circuits connected in other configurations.

FIG. 7B is a schematic diagram of a power amplifier module 220 including an output matching circuit according to another embodiment. The power amplifier module 220 of FIG. 7B is similar to the power amplifier module 200 of FIG. 7A, except that the power amplifier module 220 includes a different arrangement of a carrier substrate and a power amplifier die. In particular, the carrier substrate 221 of FIG. 7B further includes a fifth pad 204e and the power amplifier die 223 of FIG. 7B further includes a fifth pad 205e. The substrate's fifth pad 204e and the die's fifth pad 205e have been electrically connected to one another using a bond wire 207e.

The power amplifier module 220 of FIG. 7B illustrates a configuration in which the second on-chip capacitor 218 is electrically connected to the output of the power amplifier 206 through the bondwires 207c-207e. Including bondwires in the signal path between the second on-chip capacitor 218 and the power amplifier's output can provide additional harmonic attenuation at the power amplifier output, which can reduce spurious emissions. Furthermore, the bondwires can have an inductance that can help provide harmonic termination impedance at the power amplifier's output over a wider bandwidth relative to a configuration omitting the bondwires. The bondwires can have a relative high quality factor (Q-factor) and can occupy a relatively small amount of area relative to SMT inductor components and/or printed inductor components on the laminate. The bond wires can also have a length selected to tune the performance characteristics of the output matching circuit. The illustrated configuration also can provide enhanced performance relative to a configuration in which bondwires are used in combination with an off-chip capacitor. For example, the second on-chip capacitor 218 can be electrically connected to a power low supply of the power amplifier die 223. Thus, the second on-chip capacitor 218 can share a power low supply with active devices of the power amplifier, which can provide a ground return path that can enhance performance.

Additional details of the power amplifier module 220 can be similar to those described earlier with reference to the power amplifier module 200 FIG. 7A.

Although FIGS. 7A and 7B illustrate two different configurations of the second on-chip capacitor 218, the second on-chip capacitor 218 can be connected in other ways. For example, in certain implementations, the second end of the second on-chip capacitor 218 is connected to the fourth pad 205d.

FIG. 7C is a schematic diagram of a power amplifier module 240 including an output matching circuit according to another embodiment. The power amplifier module 240 of FIG. 7C is similar to the power amplifier module 200 of FIG. 7A, except that the power amplifier module 240 includes a first power high pin $V_{CC1}$, a second power high pin $V_{CC2}$, and a different arrangement of a carrier substrate and a power amplifier die. For example, the carrier substrate 241 of FIG. 7C further includes a fifth pad 204e, a fourth printed inductor 251, and a fourth surface mount capacitor 252, and the power amplifier die 243 of FIG. 7C further includes a fifth pad 205e connected to a first stage power supply input of the power amplifier circuitry 206. As shown in FIG. 7C, the substrate's fifth pad 204e and the die's fifth pad 205e have been electrically connected to one another using a bond wire 207e. Furthermore, the fourth printed inductor 251 is electrically connected between the fifth pad 204e and the first power high pin $V_{CC1}$, and the fourth surface mount capacitor 252 is electrically connected between the fifth pad 204e and the first power high pin $V_{CC1}$.

The illustrated power amplifier module 260 illustrates one configuration of a power amplifier module including separate power supply connections for input and output stages of the power amplifier circuit 206. As shown in FIG. 7C, the separate power supply connections can be separately connected to the first and second power high pins $V_{CC1}$, $V_{CC2}$. Various examples of the connectivity of the first and second power high pins $V_{CC1}$, $V_{CC2}$ can be as described below with reference to FIGS. 8A-8C. Although FIG. 7C shows one configuration of bypass capacitors and choke inductors for the first and second power high pins $V_{CC1}$, $V_{CC2}$, other configurations can be used. For example, in one embodiment, the first surface mount capacitor 212 is omitted so as to avoid instability or oscillation associated with resonances between the bypass capacitors and choke inductors.

Figure 8A:
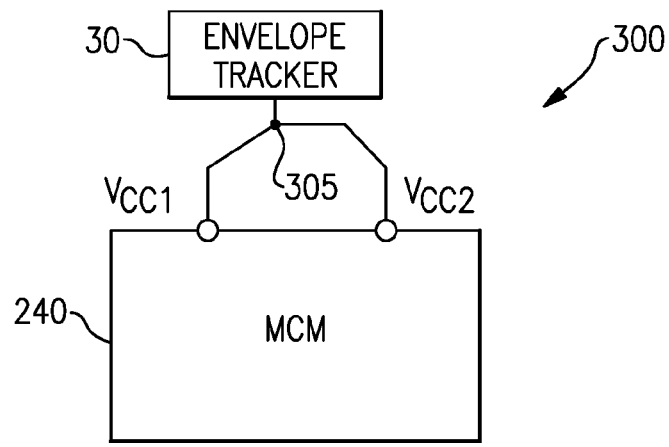
FIGS. 8A-8C are schematic diagrams of various embodiments of portions of phone boards.
Figure 8B:
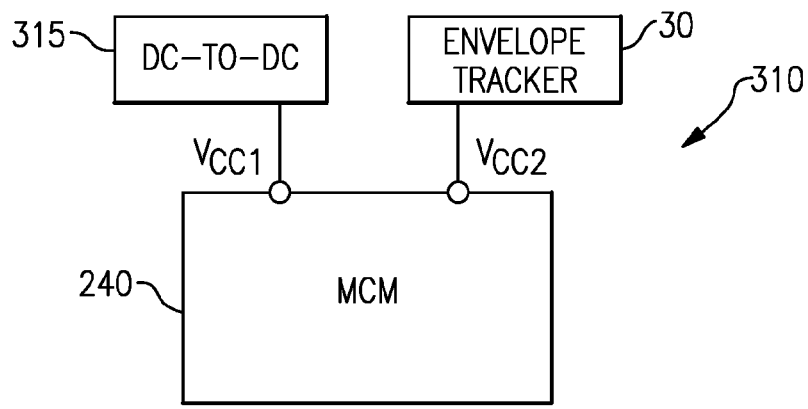
Figure 8C:
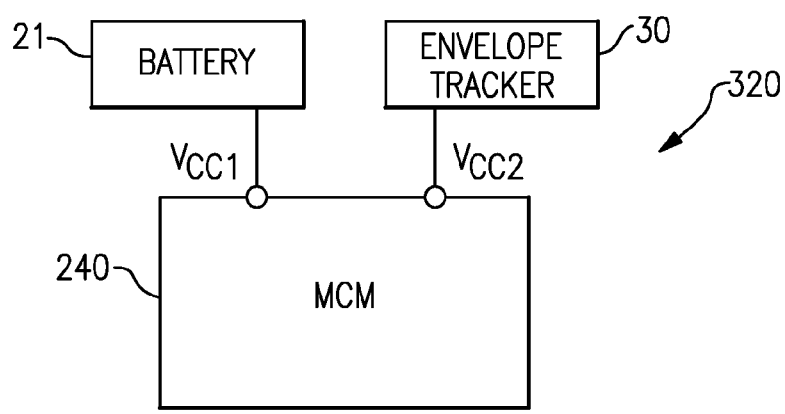

FIGS. 8A-8C are schematic diagrams of various embodiments of portions of phone boards.

FIG. 8A is a schematic diagram of a first embodiment of a portion of a phone board 300 that can be used with the power amplifier module 240 of FIG. 7C or with other power amplifier modules or MCMs that include a first power supply pin $V_{CC1}$ and a second power supply pin $V_{CC2}$. As described earlier, the first and second power supply pins $V_{CC1}$, $V_{CC2}$ can be associated with input and output stages, respectively, of a multi-stage power amplifier. In the illustrated configuration, the phone board 300 includes an envelope tracker 30 electrically connected to a node 305 using a first portion of phone board trace. Additionally, the first and second power supply pins $V_{CC1}$, $V_{CC2}$ have been electrically connected to the node 305 using a second portion and a third portion of phone board trace, respectively.

In the configuration shown in FIG. 8A, both the first and second power supply pins $V_{CC1}$, $V_{CC2}$ have been electrically connected to the envelope tracker 30. However, rather than electrically connected the first power supply pin $V_{CC1}$ to the second power supply pin $V_{CC2}$ within the power amplifier module 240, the first and second power supply pins $V_{CC1}$, $V_{CC2}$ have been electrically connected on the phone board 300. Connecting the supplies on the phone board 300 can help prevent noise associated with the power amplifier output stages from being injected into the power amplifier input stages. For example, the envelope tracker 30 can have a capacitance that can aid in grounding RF signals that reach the node 305 of the phone board 300. The capacitance of the envelope tracker 30 can provide a low impedance path to signals, including low frequency AC signals, RF signals and noise associated with the second power supply pin $V_{CC2}$ that reaches the node 305, thereby reducing the amount of signal feedback from the second power supply pin $V_{CC2}$ to the first power supply pin $V_{CC1}$. Accordingly, the implementation illustrated in FIG. 8A can provide improved performance relative to a scheme in which the first and second power supply pins $V_{CC1}$, $V_{CC2}$ are electrically connected within the power amplifier module 240.

FIG. 8B is a schematic diagram of a second embodiment of a portion of a phone board 310, which includes the power amplifier module 240, the envelope tracker 30, and a DC-to-DC converter 315. In the illustrated configuration, the first power supply pin $V_{CC1}$ has been electrically connected to the DC-to-DC converter 315 and the second power supply pin $V_{CC2}$ has been electrically connected to the envelope tracker 30. As shown in FIG. 8B, in certain implementations the input and output stages of a multi-stage power amplifier can be powered using different supply control modules.

FIG. 8C is a schematic diagram of a third embodiment of a portion of a phone board 320, which includes the power amplifier module 240, the envelope tracker 30, and the battery 21. In the illustrated configuration, the first power supply pin $V_{CC1}$ has been electrically connected to the battery 21 and the second power supply pin $V_{CC2}$ has been electrically connected to the envelope tracker 30.

As illustrated in FIGS. 8A-8C, the power amplifier module 240 can be configured to operate in a variety of different phone board implementations. In addition to the variations shown in FIGS. 8A-8C, other configurations are possible. For example, in one implementation, FIG. 8C is modified such that a DC-to-DC converter drives the second power supply pin $V_{CC2}$. Thus, the teachings herein are applicable not only to envelope tracking implementations, but to other implementation as well, including, for example, average power tracking configurations. Furthermore, although FIGS. 8A-8C illustrate a supply control module provide a power supply to a single power amplifier module, a supply control module can be configured to provide a power supply to a plurality of power amplifier modules, including, for example, single band and/or multi-band power amplifier modules. For example, a phone board can include an envelope tracker configured to drive power supply pins of two or more power amplifier modules.

Applications

Some of the embodiments described above have provided examples in connection with mobile phones. However, the principles and advantages of the embodiments can be used for any other systems or apparatus that have needs for power amplifier systems.

Such power amplifier systems can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A mobile device comprising:
    a power amplifier including an input configured to receive a radio frequency input signal and an output configured to provide an amplified radio frequency signal;
    a supply voltage biasing circuit electrically connected between the output of the power amplifier and a power high supply voltage; and
    an output matching circuit including a second-order harmonic series resonant circuit including a first capacitor and a first inductor electrically connected in series between the output of the power amplifier and a power low supply voltage, a second inductor electrically connected between the output of the power amplifier and a harmonic frequency grounding node, a second capacitor electrically connected between the output of the power amplifier and the power low supply voltage, and a third-order harmonic series resonant circuit including a third capacitor and a third inductor electrically connected in series between the harmonic frequency grounding node and the power low supply voltage.

2. The mobile device of claim 1 wherein the second inductor and the second capacitor have a resonance at about three times a fundamental frequency of the amplified radio frequency output signal.

3. The mobile device of claim 2 wherein the first inductor and the first capacitor have a resonance at about two times the fundamental frequency.

4. The mobile device of claim 2 wherein the third inductor and the third capacitor have a resonance at about three times the fundamental frequency.

5. The mobile device of claim 1 further comprising an envelope tracker configured to generate the power high supply voltage based on an envelope of the radio frequency input signal.

6. The mobile device of claim 1 wherein the output matching circuit further includes a fourth capacitor electrically connected between the harmonic frequency grounding node and an output node.

7. The mobile device of claim 1 further comprising a transceiver configured to generate the radio frequency input signal.

8. A power amplifier module comprising:
    a carrier substrate;
    a power amplifier die on the carrier substrate, the power amplifier die including a power amplifier having an input configured to receive a radio frequency input signal and an output configured to provide an amplified radio frequency signal;
    a supply voltage biasing circuit electrically connected between the output of the power amplifier and a power high supply voltage; and
    an output matching circuit including a second-order harmonic series resonant circuit including a first capacitor and a first inductor electrically connected in series between the output of the power amplifier and a power low supply voltage, a second inductor electrically connected between the output of the power amplifier and a harmonic frequency grounding node, a second capacitor electrically connected between the output of the power amplifier and the power low supply voltage, and a third-order harmonic series resonant circuit including a third capacitor and a third inductor electrically connected in series between the harmonic frequency grounding node and the power low supply voltage.

9. The power amplifier module of claim 8 wherein the second inductor and the second capacitor have a resonance at about three times a fundamental frequency of the amplified radio frequency output signal.

10. The power amplifier module of claim 9 wherein the first inductor and the first capacitor have a resonance at about two times the fundamental frequency.

11. The power amplifier module of claim 9 wherein the third inductor and the third capacitor have a resonance at about three times the fundamental frequency.

12. The power amplifier module of claim 8 further comprising an input pin configured to receive the radio frequency input signal.

13. The power amplifier module of claim 8 further comprising an output pin, and a surface mount capacitor on the carrier substrate and electrically connected between the harmonic frequency grounding node and the output pin.

14. The power amplifier module of claim 8 wherein the power amplifier die includes an on-chip capacitor electrically connected between the output of the power amplifier and the power low supply voltage.

15. The power amplifier module of claim 8 further comprising a power low pin configured to receive the power low supply voltage.

16. The power amplifier module of claim 8 further comprising a power high pin configured to receive the power high supply voltage.

17. The power amplifier module of claim 16 wherein the supply voltage biasing circuit includes a printed inductor on the carrier substrate and electrically connected between the power high pin and the output of the power amplifier.

18. A power amplifier system comprising:
- a multi-stage power amplifier including a power amplifier input stage configured to receive a radio frequency input signal and power from a first power high supply voltage, and a power amplifier output stage including an output configured to provide an amplified radio frequency signal;
- a supply voltage biasing circuit electrically connected between the output of the power amplifier output stage and a second power high supply voltage; and
- an output matching circuit including a second-order harmonic series resonant circuit including a first capacitor and a first inductor electrically connected in series between the output of the power amplifier output stage and a power low supply voltage, a second inductor electrically connected between the output of the power amplifier output stage and a harmonic frequency grounding node, a second capacitor electrically connected between the output of the power amplifier output stage and the power low supply voltage, and a third-order harmonic series resonant circuit including a third capacitor and a third inductor electrically connected in series between the harmonic frequency grounding node and the power low supply voltage.

19. The power amplifier system of claim 18 wherein the second inductor and the second capacitor have a resonance at about three times a fundamental frequency of the amplified radio frequency output signal.

20. The power amplifier system of claim 18 further comprising an envelope tracker configured to generate the second power high supply voltage based on an envelope of the radio frequency input signal.

* * * * *